United States Patent
Hol et al.

(10) Patent No.: US 6,943,464 B2
(45) Date of Patent: Sep. 13, 2005

(54) LITHOGRAPHIC APPARATUS AND MOTOR FOR USE IN THE APPARATUS

(75) Inventors: Sven Antoin Johan Hol, Eindhoven (NL); Jan Van Eijk, Eindhoven (NL); Angelo Cesar Peter De Klerk, Etten-Leur (NL); Harmen Klaas Van Der Schoot, Vught (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 10/740,576

(22) Filed: Dec. 22, 2003

(65) Prior Publication Data

US 2004/0207269 A1 Oct. 21, 2004

Related U.S. Application Data

(63) Continuation of application No. 10/222,975, filed on Aug. 19, 2002, now Pat. No. 6,717,296.

(30) Foreign Application Priority Data

Aug. 22, 2001 (EP) .............................................. 01307127

(51) Int. Cl.⁷ ........................ H02K 41/035; G03F 7/20; G03F 9/00

(52) U.S. Cl. ............... 310/12; 310/154.28; 310/156.43; 414/935

(58) Field of Search ................ 310/12, 13; 250/442.11; 414/935, 936

(56) References Cited

U.S. PATENT DOCUMENTS

| 5,886,432 | A |   | 3/1999  | Markle |
|-----------|---|---|---------|--------|
| 6,003,230 | A | * | 12/1999 | Trumper et al. ............. 33/1 M |
| 6,028,376 | A |   | 2/2000  | Osanai et al. |
| 6,043,572 | A |   | 3/2000  | Nagai et al. |
| 6,104,108 | A |   | 8/2000  | Hazelton et al. |
| 6,246,204 | B1 |  | 6/2001  | Ebihara et al. |
| 6,271,606 | B1 |  | 8/2001  | Hazelton |
| 6,285,097 | B1 |  | 9/2001  | Hazelton et al. |
| 6,285,457 | B2 |  | 9/2001  | Ukaji |
| 6,417,914 | B1 | * | 7/2002  | Li ................................ 355/75 |

FOREIGN PATENT DOCUMENTS

| EP | 1 001 512 A2  |   | 5/2000 | |
|----|---------------|---|--------|---|
| EP | 1111468 A2    | * | 6/2001 | ............. G03F/7/20 |
| EP | 1191580 A1    | * | 3/2002 | ........... H01L/21/68 |
| WO | WO01/18944 A1 |   | 3/2001 | |

* cited by examiner

Primary Examiner—Burton Mullins
(74) Attorney, Agent, or Firm—Pillsbury Winthrop Shaw Pittman LLP

(57) ABSTRACT

A Lorentz actuator provides a force between a first part and a second part of the apparatus, comprising a main magnet system, attached to a first part of the apparatus and providing a first magnetic field; a subsidiary magnet system, attached to the first part and arranged in a Halbach configuration, providing a second magnetic field; and an electrically conductive element attached to a second part of the apparatus and arranged so as to produce a force between the first and second parts of the apparatus by interaction of an electric current carried by the electrically conductive element and the combination of the first and second magnetic fields.

20 Claims, 4 Drawing Sheets

LITHOGRAPHIC APPARATUS AND MOTOR FOR USE IN THE APPARATUS

CROSS REFERENCE TO RELATED APPLICATIONS

This application is a continuation of U.S. application Ser. No. 10/222,975, filed Aug. 19, 2002 now U.S. Pat. No. 6,717,296, and claims priority to European Application 01307127.9, filed Aug. 22, 2001, the entire contents of which are herein incorporated by reference.

BACKGROUND OF THE INVENTION

1. Field of the Invention

The present invention relates to a lithographic projection apparatus.

2. Description of the Related Art

The term "patterning device" as here employed should be broadly interpreted as referring to device that can be used to endow an incoming radiation beam with a patterned cross-section, corresponding to a pattern that is to be created in a target portion of the substrate. The term "light valve" can also be used in this context. Generally, the pattern will correspond to a particular functional layer in a device being created in the target portion, such as an integrated circuit or other device (see below). An example of such a patterning device is a mask. The concept of a mask is well known in lithography, and it includes mask types such as binary, alternating phase-shift, and attenuated phase-shift, as well as various hybrid mask types. Placement of such a mask in the radiation beam causes selective transmission (in the case of a transmissive mask) or reflection (in the case of a reflective mask) of the radiation impinging on the mask, according to the pattern on the mask. In the case of a mask, the support will generally be a mask table, which ensures that the mask can be held at a desired position in the incoming radiation beam, and that it can be moved relative to the beam if so desired.

Another example of a pattering device is a programmable mirror array. One example of such an array is a matrix-addressable surface having a viscoelastic control layer and a reflective surface. The basic principle behind such an apparatus is that, for example, addressed areas of the reflective surface reflect incident light as diffracted light, whereas unaddressed areas reflect incident light as undiffracted light. Using an appropriate filter, the undiffracted light can be filtered out of the reflected beam, leaving only the diffracted light behind. In this manner, the beam becomes patterned according to the addressing pattern of the matrix-addressable surface. An alternative embodiment of a programmable mirror array employs a matrix arrangement of tiny mirrors, each of which can be individually tilted about an axis by applying a suitable localized electric field, or by employing piezoelectric actuators. Once again, the mirrors are matrix-addressable, such that addressed mirrors will reflect an incoming radiation beam in a different direction to unaddressed mirrors. In this manner, the reflected beam is patterned according to the addressing pattern of the matrix-addressable mirrors. The required matrix addressing can be performed using suitable electronics. In both of the situations described hereabove, the patterning device can comprise one or more programmable mirror arrays. More information on mirror arrays as here referred to can be seen, for example, from U.S. Pat. Nos. 5,296,891 and 5,523,193, and PCT publications WO 98/38597 and WO 98/33096. In the case of a programmable mirror array, the support may be embodied as a frame or table, for example, which may be fixed or movable as required.

Another example of a pattering device is a programmable LCD array. An example of such a construction is given in U.S. Pat. No. 5,229,872. As above, the support in this case may be embodied as a frame or table, for example, which may be fixed or movable as required.

For purposes of simplicity, the rest of this text may, at certain locations, specifically direct itself to examples involving a mask and mask table. However, the general principles discussed in such instances should be seen in the broader context of the patterning device as hereabove set forth.

Lithographic projection apparatus can be used, for example, in the manufacture of integrated circuits (ICs). In such a case, the patterning device may generate a circuit pattern corresponding to an individual layer of the IC, and this pattern can be imaged onto a target portion (e.g. comprising one or more dies) on a substrate (silicon wafer) that has been coated with a layer of radiation-sensitive material (resist). In general, a single wafer will contain a whole network of adjacent target portions that are successively irradiated via the projection system, one at a time. In current apparatus, employing patterning by a mask on a mask table, a distinction can be made between two different types of machine. In one type of lithographic projection apparatus, each target portion is irradiated by exposing the entire mask pattern onto the target portion at once. Such an apparatus is commonly referred to as a wafer stepper. In an alternative apparatus, commonly referred to as a step-and-scan apparatus, each target portion is irradiated by progressively scanning the mask pattern under the projection beam in a given reference direction (the "scanning" direction) while synchronously scanning the substrate table parallel or anti-parallel to this direction. Since, in general, the projection system will have a magnification factor M (generally<1), the speed V at which the substrate table is scanned will be a factor M times that at which the mask table is scanned. More information with regard to lithographic devices as here described can be seen, for example, from U.S. Pat. No. 6,046,792.

In a known manufacturing process using a lithographic projection apparatus, a pattern (e.g. in a mask) is imaged onto a substrate that is at least partially covered by a layer of radiation-sensitive material (resist). Prior to this imaging, the substrate may undergo various procedures, such as priming, resist coating and a soft bake. After exposure, the substrate may be subjected to other procedures, such as a post-exposure bake (PEB), development, a hard bake and measurement/inspection of the imaged features. This array of procedures is used as a basis to pattern an individual layer of a device, e.g. an IC. Such a patterned layer may then undergo various processes such as etching, ion-implantation (doping), metallization, oxidation, chemo-mechanical polishing, etc., all intended to finish off an individual layer. If several layers are required, then the whole procedure, or a variant thereof, will have to be repeated for each new layer. Eventually, an array of devices will be present on the substrate (wafer). These devices are then separated from one another by a technique such as dicing or sawing, whence the individual devices can be mounted on a carrier, connected to pins, etc. Further information regarding such processes can be obtained, for example, from the book "Microchip Fabrication: A Practical Guide to Semiconductor Processing", Third Edition, by Peter van Zant, McGraw Hill Publishing Co., 1997, ISBN 0-07-067250-4.

For the sake of simplicity, the projection system may hereinafter be referred to as the "lens." However, this term should be broadly interpreted as encompassing various types of projection system, including refractive optics, reflective optics, and catadioptric systems, for example. The radiation system may also include components operating according to any of these design types for directing, shaping or controlling the beam of radiation, and such components may also be referred to below, collectively or singularly, as a "lens". Further, the lithographic apparatus may be of a type having two or more substrate tables (and/or two or more mask tables). In such "multiple stage" devices the additional tables may be used in parallel or preparatory steps may be carried out on one or more tables while one or more other tables are being used for exposures. Dual stage lithographic apparatus are described, for example, in U.S. Pat. Nos. 5,969,441 and 6,262,796.

In an apparatus as described above it is desirable that the substrate table, which holds the substrate, and the support which may hold the mask be positioned with a very high precision. It is therefore proposed, for example, in U.S. Pat. No. 5,120,034 to use a positioning device comprising a carriage displaceable in at least two coordinate directions with respect to a base and intended for displacement of a table which is displaceable with respect to the carriage in the two coordinate directions wherein the table is coupled to the carriage solely by Lorentz forces of the magnet systems and coil systems in the two coordinate directions.

An issue in the use of Lorentz actuators in lithographic projection apparatus is the amount of heat generated in use by the coils of the Lorentz actuator, especially any heat that is produced by a Lorentz actuator mounted very close to the substrate table or the support. Any heat produced must be dissipated in order to prevent temperature changes in the substrate table and the support that could lead to losses in the accuracy of the apparatus.

Lorentz actuators include an electrically conductive element, such as a coil, and a magnet assembly. The magnet assembly produces a magnetic field which interacts with a current flowing in the electrically conductive element to produce a Lorentz force between the electrically conductive element and the magnet assembly in a direction perpendicular to the direction of the current flow and the magnetic field at that point. Typically the magnet assembly is comprised of at least one magnet on either side of the electrically conductive element to produce an approximately uniform magnetic field around the electrical conductor. Lorentz actuators do not include any iron in the coils. The magnet assembly of a Lorentz actuator does, however, comprises a back iron, formed from a material with high magnetic saturation, located on the outward side of the magnets. The back iron is typically required to be large to prevent saturation and it constitutes a substantial part of the mass of the actuator and is a source of loss of efficiency in the motor.

SUMMARY OF THE INVENTION

It is an aspect of the present invention to provide a positioning device with a Lorentz actuator having a back iron of reduced mass but no loss of performance of the actuator.

This and other aspects are achieved according to the present invention in a positioning device for positioning an object including a planar motor having a first part and a second part and configured to produce a force between the first part and the second part over a long range of movement in at least one direction. The second part is connected to a frame of the positioning device. A Lorentz actuator is configured to produce a force between the first part of the planar motor and the object over a short range of movement in at least one direction. The Lorentz actuator includes a main magnet system attached to one part that is the first part of the planar motor or the object, a subsidiary magnet system attached to the one part, and an electrically conductive element attached to the other of the first part of the planar motor and the object. The main magnet system and the subsidiary magnet system are arranged in a Halbach configuration.

This arrangement is desirable since it reduces the size of the back iron required to prevent saturation. The mass of back iron in the actuator will be reduced and will further improve the efficiency of the actuator as the moving mass of the actuator is decreased the force required to produce a given acceleration is decreased. It also increases the k-factor of the actuator (also referred to as the motor constant) which means that the force produced for a given flow of current through the coils is increased. The combination of the effects results in a significant reduction in the current to effect a given acceleration which in turn reduces the amount of heat generated by the coils.

In another embodiment of the present invention, the subsidiary magnet system includes a first and a second subsidiary magnet and the main magnet system includes a main magnet, at least a part of which is located between the two subsidiary magnets. The magnetic polarizations of the subsidiary magnets are oriented substantially mutually anti-parallel and substantially perpendicular to magnetic polarization of the main magnet.

In a still further embodiment of the present invention, the Lorentz actuator includes two magnet assemblies. The first magnet assembly includes a first main magnet system sub-assembly and a first subsidiary magnet system sub-assembly and the second magnet assembly includes a second main magnet system sub-assembly and a second subsidiary magnet system sub-assembly. At least a part of the electrically conductive element is located between the first and second magnet assemblies.

In a still further embodiment of the present invention, each magnet assembly includes first and second main magnets, oriented such that their magnetic polarizations are substantially anti-parallel to each other. The magnet assemblies further include first, second and third subsidiary magnets arranged such that at least a portion of the first main magnet is located between the first and second subsidiary magnets and at least a portion of the second main magnet is located between the second and third subsidiary magnets. The electrically conductive element comprises a first part, located between the first main magnet of the first magnet assembly and the first main magnet of the second assembly, and a second part, located between the second main magnet of the first magnet assembly and the second main magnet of the second magnet assembly. The electrically conductive element is arranged such that, when it conducts electric current, the direction of the electric current in the first part is substantially anti-parallel to the direction of the electric current in the second part.

The present invention also relates to a method of positioning an object, the method including producing a force between a first part of the positioning device and a frame of the positioning device over a long range of movement in at least one direction using a planar motor; and producing a force between a first part of the planar motor and a second part of the positioning device over a short range of movement in at least one direction using a Lorentz actuator, the second part of the positioning device being connected to the object, wherein the Lorentz actuator includes a main magnet system attached to one part of the positioning device that is the first part or the second part; a subsidiary magnet system attached to the one part of the positioning device; and an electrically conductive element attached to the other of the first part and the second part of the positioning device, the main magnet system and the subsidiary magnet system are arranged in a Halbach configuration.

Although specific reference may be made in this text to the use of the apparatus according to the invention in the manufacture of ICs, it should be explicitly understood that such an apparatus has many other possible applications. For example, it may be employed in the manufacture of integrated optical systems, guidance and detection patterns for magnetic domain memories, liquid-crystal display panels, thin-film magnetic heads, etc. One of ordinary skill will appreciate that, in the context of such alternative applications, any use of the terms "reticle", "wafer" or "die" in this text should be considered as being replaced by the more general terms "mask", "substrate" and "target portion", respectively.

In the present document, the terms "radiation" and "beam" are used to encompass all types of electromagnetic radiation, including ultraviolet radiation (e.g. with a wavelength of 365, 248, 193, 157 or 126 nm) and EUV (extreme ultra-violet radiation, e.g. having a wavelength in the range 5–20 nm), as well as particle beams, such as ion beams or electron beams.

BRIEF DESCRIPTION OF THE DRAWINGS

Embodiments of the invention will now be described, by way of example only, with reference to the accompanying schematic drawings in which:

FIG. 2b shows the magnetic field lines calculated for the configuration of FIG. 2a;

In the Figures, corresponding reference symbols indicate corresponding parts.

DETAILED DESCRIPTION

Figure 1A:
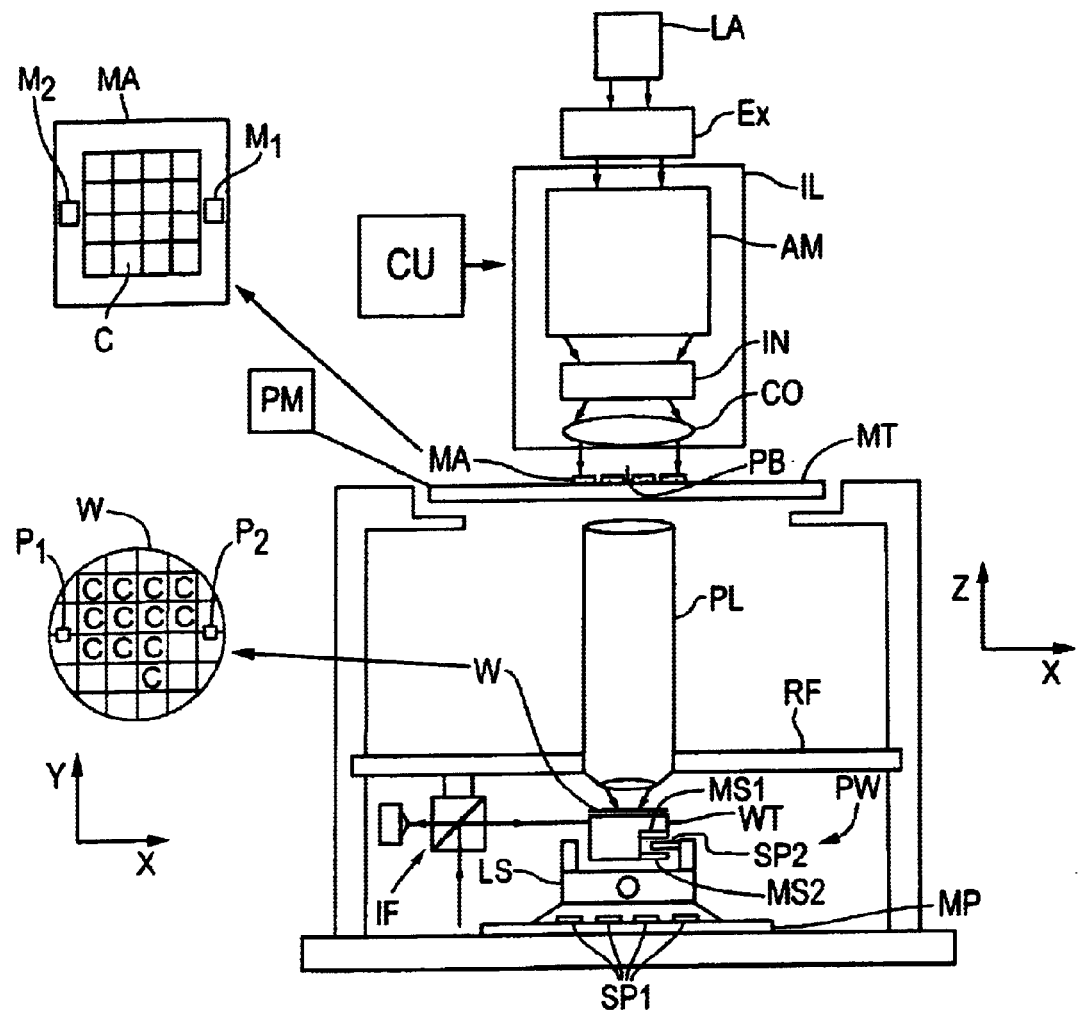
FIG. 1A depicts a lithographic projection apparatus.

FIG. 1A schematically depicts a lithographic projection apparatus according to a particular embodiment of the invention. The apparatus includes a radiation system Ex, IL that supplies a beam PB of radiation (e.g. UV or EUV radiation). In this embodiment, the radiation system also comprises a radiation source LA; a first object table (mask table) MT provided with a mask holder for holding a mask MA (e.g. a reticle), and connected to a first positioning device PM to accurately position the mask with respect to a projection system PL; a second object table (substrate table) WT provided with a substrate holder for holding a substrate W (e.g. a resist-coated silicon wafer), and connected to a second positioning device PW to accurately position the substrate with respect to the projection system PL; the projection system ("lens") PL (e.g. a refractive or catadioptric system, a mirror group or an array of field deflectors) to image an irradiated portion of the mask MA onto a target portion C (e.g. comprising one or more dies) of the substrate W. The projection system PL is supported on a reference frame RF. As here depicted, the apparatus is of a transmissive type (i.e. has a transmissive mask). However, in general, it may also be of a reflective type, for example (with a reflective mask). Alternatively, the apparatus may employ another kind of patterning device, such as a programmable mirror array of a type as referred to above. Mask MA and substrate W may be aligned using mask alignment marks $M_1$, $M_2$ and substrate alignment marks $P_1$, $P_2$.

The source LA (e.g. an excimer laser, an undulator or wiggler provided around the path of an electron beam in a storage ring or synchrotron, a laser-produced plasma source, a discharge source or an electron or ion beam source) produces of radiation. The radiation is fed into an illumination system (illuminator) IL, either directly or after having traversed a conditioner, such as a beam expander Ex, for example. The illuminator IL may comprise an adjusting device AM for setting the outer and/or inner radial extent (commonly referred to as σ-outer and σ-inner, respectively) of the intensity distribution in the beam. In addition, it will generally comprise various other components, such as an integrator IN and a condenser CO. In this way, the beam PB impinging on the mask MA has a desired uniformity and intensity distribution in its cross-section.

The beam PB subsequently intercepts the mask MA, which is held on a mask table MT. Having traversed the mask MA, the beam PB passes through the lens PL, which focuses the beam PB onto a target portion C of the substrate W. With the aid of the second positioning device PW (and interferometer IF), the substrate table WT can be moved accurately, e.g. so as to position different target portions C in the path of the beam PB. Similarly, the first positioning device PM can be used to accurately position the mask MA with respect to the path of the beam PB, e.g. after mechanical retrieval of the mask MA from a mask library, or during a scan. In general, movement of the object tables MT, WT will be realized with the aid of a long-stroke drive module (coarse positioning) and a short-stroke module (fine positioning). However, in the case of a wafer stepper (as opposed to a step-and-scan apparatus) the mask table MT may just be connected to a short stroke actuator, or may be fixed. A long stroke drive module LS is moved by a planar motor, for example, as described in U.S. Pat. No. 6,531,793. A magnet plate MP is fixed to a machine frame of the lithographic projection apparatus and the long stroke drive module LS is provided with a first set of coils SP1 that generate a force when a current is sent through the coils SP1. The force can levitate and move the long stroke drive module LS along the magnet plate MP. The substrate table WT is moved with respect to the long stroke module drive LS with the aid of Lorenz actuators comprising a second coil SP2 and magnets $MS_1$ and $MS_2$. If a current is sent through the secondary coil SP2 a force can be generated between the long stroke drive module LS and magnets $MS_1$ and $MS_2$ provided to the substrate table WT to finely position the substrate table WT. The substrate table WT can be moved up to six degrees of freedom (X, Y, Z, Rz, Ry and Rx) with respect to the long stroke drive module LS.

The depicted apparatus can be used in two different modes:
1. In step mode, the mask table MT is kept essentially stationary, and an entire mask image is projected at once (i.e. a single "flash") onto a target portion C. The substrate table WT is then shifted in the x and/or y directions so that a different target portion C can be irradiated by the beam PB;
2. In scan mode, essentially the same scenario applies, except that a given target portion C is not exposed in a single "flash". Instead, the mask table MT is movable in a given direction (the so-called "scan direction", e.g. the y direction) with a speed v, so that the beam PB is caused to scan over a mask image. Concurrently, the substrate table WT is simultaneously moved in the same or opposite direction at a speed V=Mv, in which M is the magnification of the lens PL (typically, M=¼ or ⅕). In this manner, a relatively large target portion C can be exposed, without having to compromise on resolution.

Figure 2A:
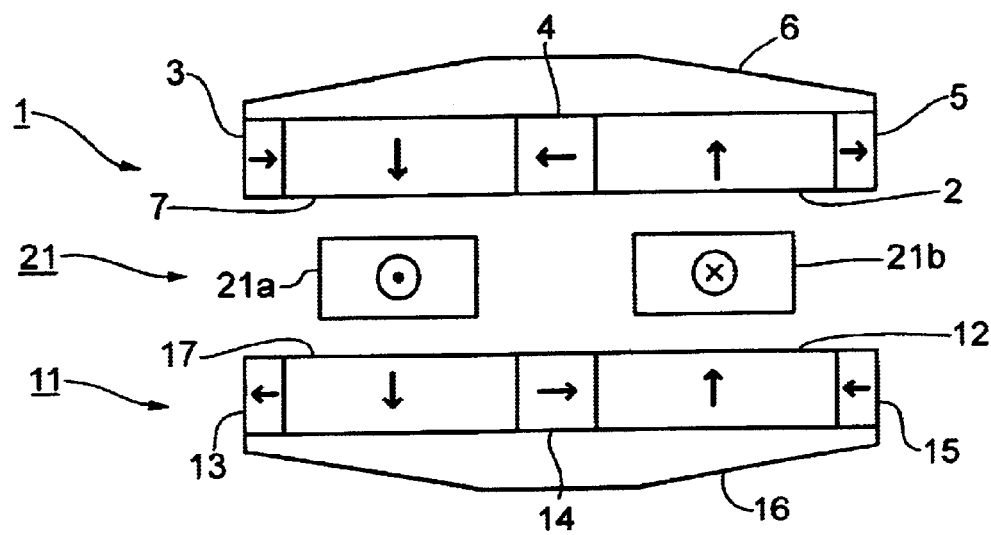
FIG. 2a shows, in cross-section, the configuration of an actuator according to the present invention.
Figure 3:
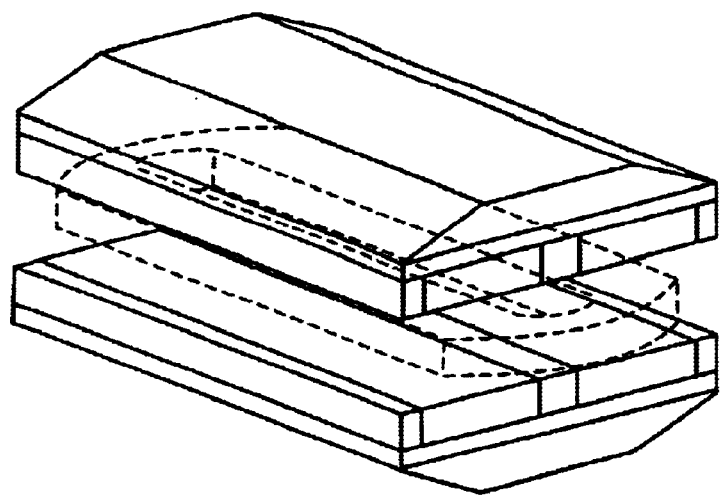
FIG. 3 shows the configuration of FIG. 2a in perspective.

FIG. 2a shows a cross section of the actuator according to a preferred embodiment of the present invention. The same actuator is shown, in perspective, in FIG. 3. In use, the actuator generates a force in a first direction (or its opposite) which may be used to drive a short-stroke drive module for positioning of the mask table MT or the substrate table WT. In FIG. 2a this first direction is a horizontal direction within the plane of the Figure. The actuator comprises a first magnet sub-assembly 1 (MS1 in FIG. 1A), a second magnet sub-assembly 11 (MS2 in FIG. 1A) and a coil 21 (SP2 in FIG. 1A). The first and second magnet sub-assemblies 1, 11 define a space between them in a second direction, perpendicular to the first direction. The coil 21 is located in this space.

The combination of the first and second magnet sub-assemblies 1, 11 forms a magnet assembly that is mounted on the substrate table WT or the mask table MT to be driven by the actuator. The coil 21 is mounted on the long-stroke module (not shown) or, in the case of a mask table MT of a wafer stepper apparatus that does not have a long-stroke module (as described above), on a fixed portion of the apparatus.

Figure 1B:
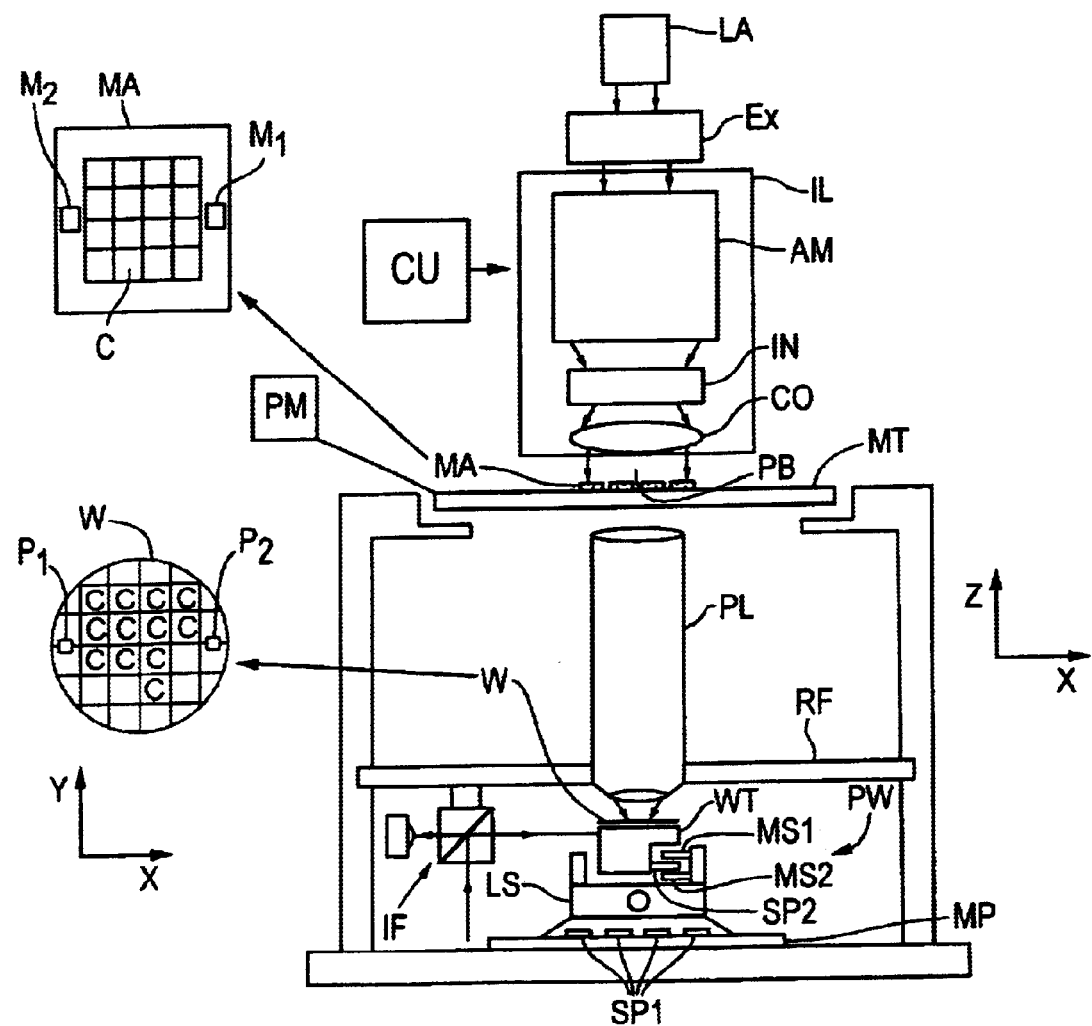
FIG. 1B depicts a lithographic projection apparatus according to another exemplary embodiment.

Although the first and second magnet sub-assemblies MS1 and MS2 may alternatively be mounted on the long-stroke module LS and the coil SP2 on the substrate table or the mask table as shown in FIG. 1B, the configuration of FIG. 1A is preferred since it facilitates the provision of power and cooling to the coil.

The first magnet sub-assembly 1 is composed of a first main magnet 2, a second main magnet 7, a first subsidiary magnet 5, a second subsidiary magnet 4 and a third subsidiary magnet 3. The second magnet sub-assembly 11 correspondingly has a first main magnet 12, a second main magnet 17, a first subsidiary magnet 15, a second subsidiary magnet 14 and a third subsidiary magnet 13. In a preferred arrangement, the main magnets are permanent magnets consisting of Ni-coated Vacodym722HR having a magnetic remanence of $B_r=1.47$ Tesla (T) and the subsidiary magnets consist of Ni-coated Vacodym362TP with a magnetic remanence of $B_r=1.30$ Tesla (T) and high coercive field strength, as produced by Vacuumschmelze GmbH.

Each of the magnet sub-assemblies is arranged such that the component magnets are adjacent to one another in the first direction, as defined above. In this arrangement, a subsidiary magnet is located on either side of each of the main magnets. For example, the first main magnet 2 of the first magnet sub-assembly 1 is located between the first subsidiary magnet 5 and the second subsidiary magnet 4 of the first magnet sub-assembly. Similarly, the second main magnet 7 of the first magnet sub-assembly 1 is located between the second subsidiary magnet 4 and the third subsidiary magnet 3. The second magnet sub-assembly is arranged in a similar fashion such that, in the complete magnet assembly, the corresponding magnets in the two sub-assemblies 1, 11 are facing each other.

Each of the magnet sub-assemblies has a back iron 6, 16, respectively. In each sub-assembly the back iron is located on the other side of the magnets to the space that is defined between the magnet sub-assemblies. The back iron adjoins each of the main and each of the subsidiary magnets in the sub-assembly and preferably entirely covers the surfaces of the magnets. The back iron also preferably tapers, at least partly, in the direction away from the space between the magnet sub-assemblies. The back iron is preferably formed from CoFe.

The coil 21 (SP2 in FIG. 1), having two sides 21a and 21b (as shown in FIG. 2a), is located between the magnet sub-assemblies 1, 11 (MS in FIG. 1) and is comprised of orthocyclic windings. The coil is arranged such that, where it is located between the first and second magnet sub-assemblies, the wires that it is composed from are perpendicular to both the first and second directions defined above. As shown in FIG. 2a, the wires are oriented in a direction perpendicular to the plane of the Figure.

The magnets in the first and second magnet sub-assemblies 1, 11 are oriented such that the magnetic polarizations of the first main magnet 2 in the first magnet sub-assembly is parallel to the magnetic polarization of the first main magnet 12 of the second magnet sub-assembly and in a direction perpendicular to the first direction, defined above, namely perpendicular to the direction of the force generated by the actuator. The second main magnets 7, 17 are oriented such that their magnetic polarizations are parallel to one another and anti-parallel to the magnetic polarizations of the first main magnets 2, 12.

The subsidiary magnets of the magnet sub-assemblies are arranged in the so-called Halbach configuration. The subsidiary magnets are oriented such that their magnetic polarizations are perpendicular to those of the main magnets. As stated above, each of the main magnets is located between two subsidiary magnets of the magnet sub-assembly. These pairs of subsidiary magnets are oriented such that their magnetic polarizations are anti-parallel to one another. Furthermore, the pairs of corresponding subsidiary magnets in the first and second magnet sub-assemblies (which, as described above, face each other across the separation between the two magnet sub-assemblies), for example the first subsidiary magnet 5 of the first magnet sub-assembly and the first subsidiary magnet 15 of the second magnet sub-assembly, are also arranged such that their magnetic polarizations are anti-parallel to one another.

Figure 2B:
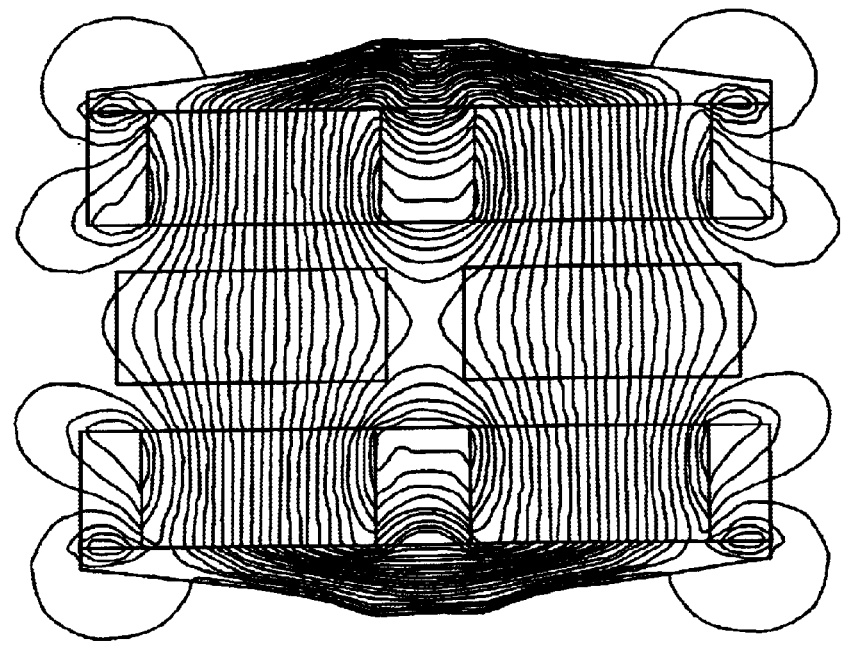

The resulting magnetic field that this configuration produces, as shown in FIG. 2b, regions of approximately uniform magnetic field between the two pairs of main magnets. The two sides of the coil 21a, 21b are located in these regions. When an electric current is passed through the coil, the current flow through the two sides of the coil is in opposite directions. Therefore, since the directions of magnetic field in the two regions in which the two sides of the coil 21a, 21b are located are also opposite, the force exerted on the two sides of the coil is in the same direction (perpendicular to both the magnetic field and the current flow).

Figure 4:
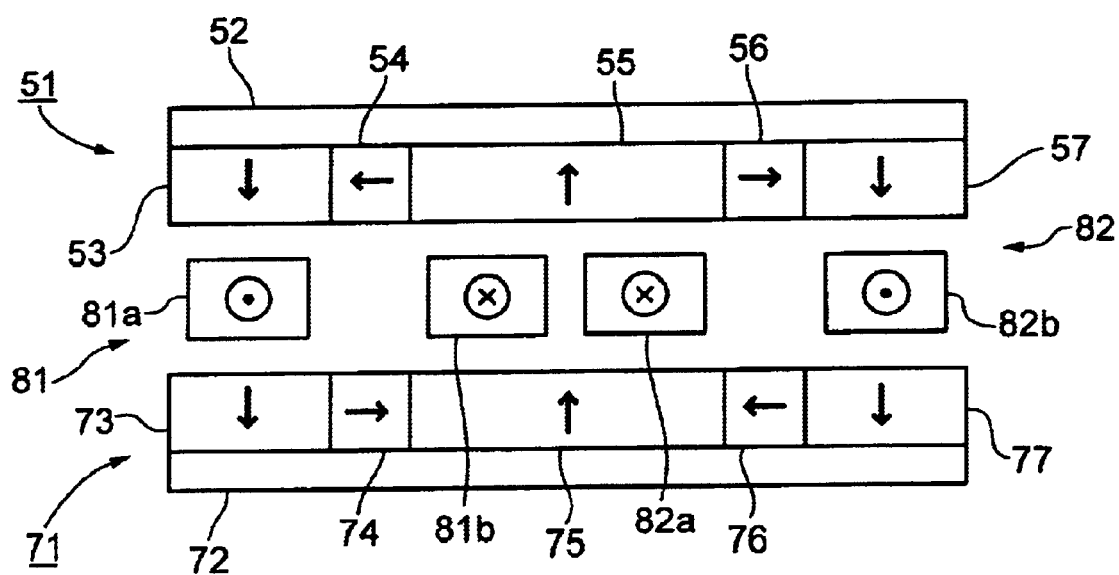
FIG. 4 shows, in cross-section, the configuration of an alternative actuator according to the present invention.

FIG. 4 shows, in cross-section, the configuration of an alternative actuator of the present invention. This configuration comprises two coils 81 and 82. Therefore the structure of the first and second magnet sub-assemblies 51, 71 is different to those depicted in FIG. 2a. Each magnet sub-assembly is comprised of a first main magnet 57, 77, a second main magnet 55, 75, a third main magnet 53, 73, first subsidiary magnet 56, 76, second subsidiary magnet 54, 74 and, as in the previous configuration, a back iron 52, 72.

The main magnets are oriented such that the magnetic polarization of the first main magnet 57 of the first magnet sub-assembly is parallel to that of the first main magnet 77 of the second magnet sub-assembly, the magnetic polarization of the second main magnet 55 of the first magnet sub-assembly is parallel to that of the second main magnet 75 of the second magnet sub-assembly, and the magnetic polarization of the third main magnet 53 of the first magnet sub-assembly is parallel to that of the third main magnet 73 of the second magnet sub-assembly. As in the configuration of FIG. 2a, all of the main magnets are oriented such that their magnetic polarizations are perpendicular to the direction of the force produced by the actuator. In addition, the first main magnets 57, 77 and the third main magnets 53, 73 are oriented such that their magnetic polarizations are anti-parallel to those of the second main magnets 55, 75.

The first subsidiary magnets 56, 76 are located between the first main magnets 57, 77 and the second main magnets 55, 75 and the second subsidiary magnets 54, 74 are located between the second main magnets 55, 75 and the third main magnets 53, 73. Consequently, the second main magnets are located between the subsidiary magnets of each magnet sub-assembly.

The subsidiary magnets of the first magnet sub-assembly 51 are oriented such that their magnetic polarizations are mutually anti-parallel and perpendicular to the magnetic polarization of the second main magnet 55. The subsidiary magnets of the second magnet sub-assembly are oriented in corresponding fashion and such that the magnetic polarization of the first subsidiary magnet 56 of the first magnet sub-assembly 51 is anti-parallel to the magnetic polarization of the first subsidiary magnet 76 of the second magnet sub-assembly 71 and the magnetic polarization of the second subsidiary magnet 54 of the first magnet sub-assembly 51 is anti-parallel to the magnetic polarization of the second subsidiary magnet 74 of the second magnet sub-assembly 71. The resulting magnetic field between the main magnets of the two magnet sub-assemblies is approximately uniform.

The coils are arranged such that the first portion 81a of the first coil 81 is located between the third main magnets 53, 73, the second portion 81b of the first coil 81 and the first portion 82a of the second coil 82 are located between the second main magnets 55, 75 and the second portion 82b of the second coil 82 is located between the first main magnets 57, 77. When an electric current is passed through the coils 81 and 82, the directions of the flow of electric current in the second part 81b of the first coil 81 and the first part 82a of the second coil 82 are mutually parallel and are anti-parallel to the directions of the flow of electric current in the first part 81a of the first coil 81 and the second part 82b of the second coil 82. Since the direction of the magnetic field between the second main magnets 55, 75 is opposite to the directions of the magnetic field between the first main magnets 57, 77 and the third main magnets 53, 73, the forces produced on each of the parts 81a, 81b, 82a, 82b of the coils 81 and 82 (in a direction perpendicular to both the direction of the flow of current and the magnetic field) are in the same direction.

While specific embodiments of the invention have been described above, it will be appreciated that the invention may be practiced otherwise than as described. The description is not intended to limit the invention.

What is claimed is:

1. A positioning device for positioning an object, the positioning device comprising:
    a planar motor comprising a first part and a second part and configured to produce a force between the first part and the second part over a long range of movement in at least one direction, the second part being connected to a frame of the positioning device; and
    a Lorentz actuator configured to produce a force between the first part of the planar motor and the object over a short range of movement in at least one direction, the Lorentz actuator comprising:
        a main magnet system attached to one part that is the first part of the planar motor or the object;
        a subsidiary magnet system attached to the one part; and
        an electrically conductive element attached to the other of the first part of the planar motor and the object, wherein the main magnet system and the subsidiary magnet system are arranged in a Halbach configuration; the subsidiary magnet system comprises two subsidiary magnets; the main magnet system comprises a main magnet, at least a part of which is located between the two subsidiary magnets; the magnetic polarizations of the subsidiary magnets being oriented substantially mutually anti-parallel and substantially perpendicular to the magnetic polarization of the main magnet.

2. A positioning device according to claim 1, wherein the main magnet system is comprised of a first main magnet system sub-assembly and a second main magnet system sub-assembly; the subsidiary magnet system is comprised of a first subsidiary magnet system sub-assembly and a second subsidiary magnet system sub-assembly; and at least a part of the electrically conductive element is located between a first magnet assembly, comprised of the first main and subsidiary magnet system sub-assemblies, and a second magnet assembly, comprised of the second main and subsidiary magnet system sub-assemblies.

3. A positioning device according to claim 2, wherein each main magnet system sub-assembly comprises a first and a second main magnet oriented such that their magnetic polarizations are substantially mutually anti-parallel.

4. A positioning device according to claim 3, wherein each of the subsidiary magnet system sub-assemblies comprises a first, a second and a third subsidiary magnet; and each of the subsidiary magnet system sub-assemblies is arranged such that:
    at least a part of the first main magnet is located between the first and second subsidiary magnets;
    at least a part of the second main magnet is located between the second and the third subsidiary magnets;
    the first and second subsidiary magnets are oriented such that their magnetic polarizations are substantially mutually anti-parallel and substantially perpendicular to that of the first main magnet; and
    the second and third subsidiary magnets are oriented such that their magnetic polarizations are substantially mutually anti-parallel and substantially perpendicular to that of the second main magnet.

5. A positioning device according to claim 3, wherein the electrically conductive element comprises:
    a first part, located between the first main magnets of the first and second main magnet system sub-assemblies; and
    a second part, located between the second main magnets of the first and second main magnet system sub-assemblies, wherein the electrically conductive element is arranged such that, when it conducts electric current, the direction of the electric currents in the first and second parts are substantially mutually anti-parallel.

6. A positioning device according to claim 2, wherein each main magnet system sub-assembly comprises a first, second and a third main magnet, arranged such that at least a part of the second main magnet is located between the first and third main magnets; and the main magnets are oriented such that the magnetic polarization of the second main magnet is substantially anti-parallel to that of the first and the third main magnets.

7. A positioning device according to claim 6, wherein each of the subsidiary magnet system sub-assemblies comprises a first and a second subsidiary magnet; and each of the subsidiary magnet system sub-assemblies is arranged such that:

at least a pair of the second main magnet is located between the first and second subsidiary magnets; and the first and second subsidiary magnets are oriented such that their magnetic polarizations are substantially mutually anti-parallel and substantially perpendicular to that of the second main magnet.

8. A positioning device according to claim 6, wherein the electrically conductive element comprises:

a first part of a first coil, located between the first main magnets of the first and second main magnet system sub-assemblies;

a second part of the first coil and a third part of a second coil, located between the second main magnets of the first and second main magnet system sub-assemblies; and a fourth part of the second coil, located between the third main magnets of the first and second main magnet system sub-assemblies.

9. A positioning device according claim 1, wherein the electrically conductive element is connected to the first part of the planar motor and the main magnet system and the subsidiary magnet system are connected to the object.

10. A positioning device according to claim 1, wherein the short range of movement is about 10 percent of the total size of the main magnet system and the subsidiary magnet system.

11. A positioning device according to claim 1, wherein the short range of movement is about 1 cm and the long range of movement is longer than 30 cm.

12. A positioning device according to claim 1, further comprising a back iron adjoining each of the main magnet system and the subsidiary magnet system, wherein the back iron has a varying thickness.

13. A positioning device according to claim 12, wherein the back iron is formed of CoFe.

14. A positioning device according to claim 1, wherein the subsidiary magnets are smaller than the main magnet.

15. A positioning device according to claim 1, wherein each of the subsidiary magnets has a higher coercive field strength than the main magnet.

16. A positioning device according to claim 1, wherein a magnetic remanence of the two subsidiary magnets are equal to each other and smaller than a magnetic remanence of the main magnet.

17. A method for positioning an object using a positioning device, the method comprising:

producing a force between a first part of the positioning device and a frame of the positioning device over a long range of movement in at least one direction using a planar motor; and producing a force between a first part of the planar motor and a second part of the positioning device over a short range of movement in at least one direction using a Lorentz actuator, the second part of the positioning device being connected to the object, wherein the Lorentz actuator comprises:

a main magnet system attached to one part of the positioning device that is the first part or the second part;

a subsidiary magnet system attached to the one part of the positioning device; and an electrically conductive element attached to the other of the first part or the second part of the positioning device, wherein the main magnet system and the subsidiary magnet system are arranged in a Halbach configuration; the subsidiary magnet system comprises two subsidiary magnets; the main magnet system comprises a main magnet, at least a part of which is located between the two subsidiary magnets; the magnetic polarizations of the subsidiary magnets being oriented substantially mutually anti-parallel and substantially perpendicular to the magnetic polarization of the main magnet.

18. A method according to claim 17, wherein the short range of movement is about 10 percent of the total size of the main magnet system and the subsidiary magnet system.

19. A method according to claim 17, wherein the short range of movement is about 1 cm and the long range of movement is longer than 30 cm.

20. A positioning device for positioning an object, the positioning device comprising:

a planar motor configured to produce a force between a first part of the positioning device and a frame of the positioning device over a long range of movement in at least one direction; and a Lorentz actuator configured to produce a force between the first part of the positioning device and a second part of the positioning device over a short range of movement in at least one direction, the second part of the positioning device being connected to the object, the Lorentz actuator comprising:

a main magnet system attached to one part of the positioning device that is the first part or the second part;

a subsidiary magnet system attached to the one part of the positioning device; and an electrically conductive element attached to the other of the first part or the second part of the positioning device, wherein the main magnet system and the subsidiary magnet system are arranged in a Halbach configuration; the subsidiary magnet system comprises two subsidiary magnets; the main magnet system comprises a main magnet, at least a part of which is located between the two subsidiary magnets; the magnetic polarizations of the subsidiary magnets being oriented substantially mutually anti-parallel and substantially perpendicular to the magnetic polarization of the main magnet.

\* \* \* \* \*